(12) United States Patent
Gatard et al.

(10) Patent No.: US 10,797,652 B2
(45) Date of Patent: Oct. 6, 2020

(54) DC-TO-DC CONVERTER BLOCK, CONVERTER, AND ENVELOPE TRACKING SYSTEM

(71) Applicant: WUPATEC, Limoges (FR)

(72) Inventors: Emmanuel Gatard, Panazol (FR); Pierre Lachaud, Saint Just le Martel (FR)

(73) Assignee: WUPATEC, Limoges (FR)

( * ) Notice: Subject to any disclaimer, the term of this patent is extended or adjusted under 35 U.S.C. 154(b) by 17 days.

(21) Appl. No.: 15/779,338

(22) PCT Filed: Nov. 25, 2016

(86) PCT No.: PCT/FR2016/053098
§ 371 (c)(1),
(2) Date: May 25, 2018

(87) PCT Pub. No.: WO2017/089726
PCT Pub. Date: Jun. 1, 2017

(65) Prior Publication Data
US 2018/0309410 A1 Oct. 25, 2018

(30) Foreign Application Priority Data
Nov. 27, 2015 (FR) ..................................... 15 61447

(51) Int. Cl.
*H03F 3/04* (2006.01)
*H03F 1/02* (2006.01)
(Continued)

(52) U.S. Cl.
CPC .......... *H03F 1/0244* (2013.01); *H02M 3/158* (2013.01); *H03F 1/0277* (2013.01);
(Continued)

(58) Field of Classification Search
CPC .......... H03F 1/0244; H03F 3/21; H03F 3/193; H03F 1/0277; H03F 2203/21145;
(Continued)

(56) References Cited

U.S. PATENT DOCUMENTS 6,781,452 B2 * 8/2004 Cioffi .................... H03F 1/0205
330/10
8,718,188 B2 5/2014 Balteanu et al.
(Continued)

FOREIGN PATENT DOCUMENTS

CN 10285710 A 1/2013
EP 2816729 A1 12/2014

OTHER PUBLICATIONS

Miaja et al., "Enhancements of the Multiple Input Buck Converter used for Envelope Tracking Applications by Improved Output Filter Design and Multiphase Operation", 2012, Energy Conversion Congress and Exposition, pp. 1841-1848, XP032467403.
(Continued)

*Primary Examiner* — Khanh V Nguyen
(74) *Attorney, Agent, or Firm* — Nixon & Vanderhye

(57) ABSTRACT

A DC-to-DC converter block with multiple supply voltages includes a power circuit, the power circuit including N depletion-mode HEMT transistors (T3_1, T3_2, T3_N), N being a natural number greater than or equal to 3. The DC-to-DC converter block also includes a gate drive circuit for the N depletion-mode HEMT transistors (T3_1, T3_2, T3_N) of the power circuit, the drive circuit including depletion-mode HEMT transistors (T1_1, T2_1, T1_2, T2_2, T1_N, T2_N) configured to drive the gates of the N depletion-mode HEMT transistors (T3_1, T3_2, T3_N) of the power circuit, and the power circuit being powered by N positive and non-zero supply voltages, namely a lower supply voltage (VDD_1), an upper supply voltage (VDD_N), and (N−2) intermediate supply voltages
(Continued)

(VDD_2) distributed between the lower (VDD_1) and upper (VDD_N) supply voltages.

11 Claims, 1 Drawing Sheet

(51) Int. Cl.
*H03F 3/193* (2006.01)
*H02M 3/158* (2006.01)
*H03F 3/21* (2006.01)

(52) U.S. Cl.
CPC .............. *H03F 3/193* (2013.01); *H03F 3/21* (2013.01); *H03F 1/0211* (2013.01); *H03F 2200/102* (2013.01); *H03F 2200/451* (2013.01); *H03F 2200/504* (2013.01); *H03F 2200/511* (2013.01); *H03F 2203/21145* (2013.01)

(58) Field of Classification Search
CPC ......... H03F 2200/511; H03F 2200/102; H03F 2200/451; H02M 3/158
USPC ................................ 330/129, 279, 285, 297
See application file for complete search history.

(56) References Cited

U.S. PATENT DOCUMENTS

| | | | |
|---|---|---|---|
| 8,829,993 B2* | 9/2014 | Briffa | H03F 1/025 330/136 |
| 9,106,184 B2* | 8/2015 | Ohnishi | H03F 1/0266 |
| 9,349,715 B2 | 5/2016 | Briere | |
| 9,641,080 B2* | 5/2017 | Hawawini | H02M 3/158 |
| 9,768,731 B2* | 9/2017 | Perreault | H03G 3/004 |
| 9,800,274 B2* | 10/2017 | Yan | H04B 1/0475 |
| 2002/0063601 A1 | 5/2002 | Yamamoto et al. | |
| 2007/0262755 A1 | 11/2007 | Hung et al. | |
| 2008/0136390 A1 | 6/2008 | Briere et al. | |
| 2010/0117727 A1 | 5/2010 | Dawson et al. | |
| 2011/0298545 A1 | 12/2011 | Morimoto et al. | |
| 2015/0097624 A1 | 4/2015 | Olson et al. | |

OTHER PUBLICATIONS

Shinjo et al., "High Speed, High Analog Bandwidth Buck Converter Using GaN HEMTs for Envelope Tracking Power Amplifier Applications", 2013, Wireless Sensors and Sensor Networks (WISNET), 2013 IEEE Topical Conference, pp. 13-15, XP032351233.

Peng et al., "100 MHz, 85% Efficient Integrated AlGaAs/GaAs Supply Modulator for RF Power Amplifier Modules", Applied Power Electronics Conference and Exposition (APEC), IEEE, 2013, pp. 672-678, XP032410409.

Peng et al., "A 150MHz, 84% efficiency, Two Phase Interleaved DC-DC Converter in AlGaAs/GaAs P-HEMT Technology for Integrated Power Amplifier Modules", Radio Frequency Integrated Circuits Symposium (RFIC), IEEE, 2010, pp. 259-262, XP031684168.

Miaja et al., "A linear assisted DC/DC converter for Envelope Tracking and Envelope Elimination and Restoration applications", 2010, IEEE Energy Conversion Congress and Exposition, pp. 3825-3832.

Rodriguez et al., "A Multiple-Input Digitally Controlled Buck Converter for Envelope Tracking Applications in Radiofrequency Power Amplifiers", IEEE Transactions on Power Electronics, 2010, pp. 369-381, vol. 25, No. 2.

Garcia et al., "A overview of fast dc-dc converters for envelope amplifier in RF transmitters", IEEE Transactions on Power Electronics, 2012, vol. 28, No. 10.

Brackle et al., "Envelope tracking of a radio frequency amplifier for Long Term Evolution using a three-level class-G modulator", Advances in Radio Science, 2013, pp. 207-202, vol. 11.

International Search Report, dated Jul. 25, 2017, from corresponding PCT application No. PCT/FR2016/053098.

French Search Report, dated Aug. 11, 2016, from corresponding FR application No. 1561447.

\* cited by examiner

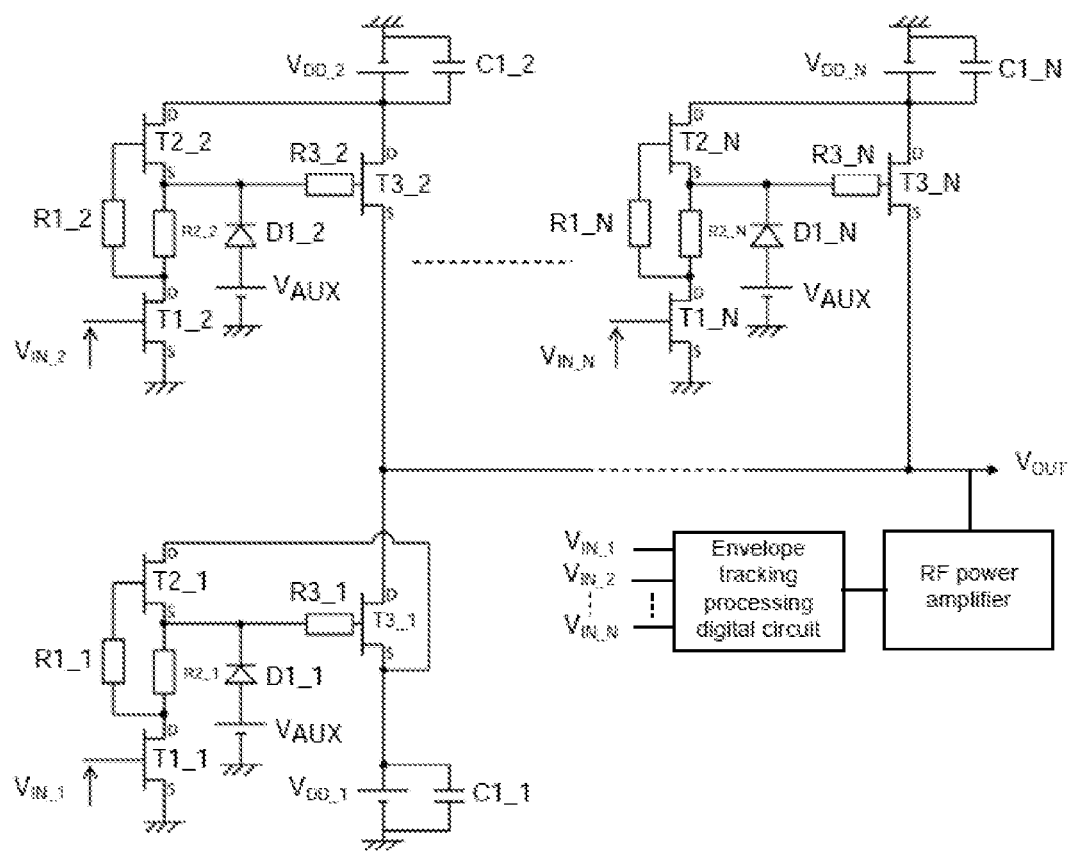

DC-TO-DC CONVERTER BLOCK, CONVERTER, AND ENVELOPE TRACKING SYSTEM

The present invention relates to the field of direct-direct (dc/dc) converters, and relates in particular to a multi-power supply voltage dc/dc converter block, to a multi-power supply voltage dc/dc converter comprising the same, and to an envelope tracking system associated therewith.

The constant increase in wireless communication speeds requires the use of complex modulations with high spectral efficiency such as OFDM (orthogonal frequency division multiplexing), these modulations having strong crest factors (ratio between the peak power and the average power of the signal).

The RF power amplifiers which are supplied in power by a direct power supply voltage provide a maximum efficiency only when they are driven in the compression region, that is, at the peak power of the signal to be emitted. However, most of the time, the amplifier provides a power well below its maximum power, close to the average power of the signal to be emitted, the efficiency of the amplifier being under these conditions well below its maximum efficiency.

The envelope tracking technique is a power supply technique for improving the efficiency of the RF power amplifiers, as it replaces the constant dc power supply of the amplifier with a dynamic dc power supply which tracks the amplitude of the RF signal to be emitted. The envelope tracking technique allows to dynamically adjust the power supply voltage of the RF power amplifier such that it is always driven in the compression region and therefore at its maximum efficiency, regardless of the power level of the envelope of the RF signal, this technique allowing, for the modern modulation formats, to significantly improve the efficiency of the RF power amplifiers while satisfying the requirements of the standards in terms of linearity. In the case of an envelope-tracking RF power amplifier, the power supply voltage is, by definition, constantly readjusted in order to ensure that the amplifier is always driven in the compression region and therefore at its maximum efficiency, regardless of the desired power level for emission.

The power supply voltage of an envelope-tracking RF power amplifier is generated by a dc/dc converter (also called bias modulator) allowing to generate a wideband direct control signal, the bias modulator being generally formed from a so-called hybrid dc/dc converter which is a tradeoff between efficiency and linearity. The hybrid dc/dc converter comprises a dc/dc converter part having a high efficiency in pure switching and operating at low frequencies, and a linear amplification part allowing to track the fast variations of the envelope signal. The high efficiency dc/dc conversion relies on pure switching converters of buck, boost, multi-phase buck or boost, or multi-power supply input buck (by power supply voltage switching) type. The linear amplification is performed by an ultra-linear amplifier operating mainly in class "A" or "AB". However, the linear amplification part which has a low efficiency strongly deteriorates the overall efficiency of the hybrid dc/dc converter. Furthermore, the more important the bandwidth covered by the linear amplification part, the more the overall efficiency is affected by the low efficiency of the linear amplification part.

Another technique known and commonly used to generate an envelope-tracking direct control signal relies only on the sole use of a dc/dc converter in pure switching. This technique has the advantage of providing a higher efficiency, but often to the detriment of the linearity and of the bandwidth. This type of converters relies on architectures of buck, boost, multi-phase buck or boost, or multi-power supply input buck type. In this configuration, the use of multi-power supply input converters of buck type has the advantage of reducing the output residual ripple, increasing the bandwidth and also reducing the switching losses in the power transistors.

An alternative technique to the conventional envelope tracking technique and to the bias modulators previously described consists in relying on the generation of an envelope tracking signal of multi-level (or discrete levels) type. This technique is intended to apply a power supply voltage to the RF amplifier among several possible voltage levels, these voltage levels being applied either directly to the RF amplifier or using a low-pass filter intended to control the rise and fall times between each voltage to be applied to the RF amplifier. This type of technique is necessarily coupled with a predistorsion technique in order to preserve the overall linearity of the system, the number of voltage levels can, for example, vary from 2 to 16 according to the capacities of the converter and to the needs of the application. The converters for this envelope tracking technique are of buck, multi-level buck, boost, multi-phase buck or boost, or multi-power supply input buck (by power supply voltage switching) type, the multi-power supply input converters being particularly adapted to this envelope tracking technique as their operation consists in selecting a power supply voltage from the power supply voltages available at the input of the converter and being thus faster to change the voltage.

The bias modulators for the envelope tracking technique allowing to generate a discrete-level or wideband direct control signal rely on switched-mode converters, that is, by voltage switching, regardless of the type of modulator: hybrid, switching alone or power supply voltage selection.

The multi-power supply input converters use technologies identical to those used in the switched-mode power supplies, these power supplies using MOSFET (metal-oxide semiconductor field-effect) transistors in silicon technology which have the advantage of being widely tested and of being available in complementary technologies (with N or P channel), the gates of the MOSFET transistors being generally driven by silicon integrated circuits implementing the bootstrap technique.

However, the MOSFET transistors in silicon technology prove to have a switching frequency very limited for high-power applications. The solution to this problem necessarily requires the use of new materials such as gallium nitride (GaN). For such material, (normally closed) depletion HEMT field-effect transistors or (normally open) enhancement-mode HEMT (high-electron-mobility) field-effect transistors exist from different manufacturing processes. They allow to reach higher operation frequencies, but use bootstrap-type gate driving devices in silicon technology and depend on their efficiency. Furthermore, the use of (normally closed) depletion HEMT transistors together with a bootstrap-type gate driving device is an obvious problem during the circuit booting phase, the bootstrap-type gate driving device requiring, according to its operation principle, to continuously switch the transistors.

Regardless of the envelope tracking technique and of the bias modulator architecture used, the growing increase of the modulation bandwidths requires to provide switched-mode power supplies able to operate at very high switching frequencies, these frequencies being considerably higher than those the available technologies of dc/dc converters can allow, especially in the case of high-power applications.

The manufacturers of switched-mode power supplies thus turn to enhancement-mode HEMT field-effect transistors in GaN technology driven by silicon-based bootstrap-type driving devices, this type of transistor being developed especially for the power supply voltage conversion applications and allowing to significantly improve the efficiency with respect to the silicon-based MOSFET transistors without necessarily reaching bandwidths sufficient for the high-power applications related to the envelope tracking technique, the dc/dc converters using this type of transistors mainly having a limited switching frequency due firstly to their bootstrap-type driving device and secondly to the efficiency of the enhancement-mode HEMT transistors developed for power supply voltage conversion applications which do not require large bandwidths.

The (normally closed) depletion HEMT field-effect transistors in GaN technology, generally used for radiofrequency and microwave amplification applications, allow to reach operation frequencies which are very high even for high powers. However, neither the silicon-based bootstrap-type gate driving devices, nor the existing topologies of the dc/dc converters allow to actually use this type of component for very high-frequency and high-power power supply switching applications for the envelope tracking technique.

The present invention is intended to solve the disadvantages of the prior art, by providing a high-frequency and high-power multi-power supply voltage dc/dc converter block for the envelope tracking technique for high-power radiofrequency and/or microwave amplification applications in order to allow a technologic disruption related to the efficiency/bandwidth limitation applied by the existing dc/dc converters which made, until now, the envelope tracking technique hard to apply for the high-power applications with high speeds, said multi-power supply voltage dc/dc converter block according to the present invention comprising a power circuit with at least three depletion HEMT transistors and a driving circuit with depletion HEMT transistors, the power circuit being power supplied with at least three non-zero and positive power supply voltages.

The present invention also provides a multi-power supply voltage dc/dc converter for the envelope tracking technique comprising the multi-power supply voltage dc/dc converter block, and a system for the envelope tracking technique comprising a multi-power supply voltage dc/dc converter for the envelope tracking technique according to the present invention and a radiofrequency (RF) power amplifier.

The present invention thus relates to a high-frequency and high-power multi-power supply voltage dc/dc converter block comprising a power circuit whose output constitutes the output of the dc/dc converter block, the power circuit comprising N depletion HEMT (high-electron-mobility) transistors, N being a positive integer greater than or equal to 3, the dc/dc converter block further comprising a driving circuit of the gates of the N depletion HEMT transistors of the power circuit, characterized in that the driving circuit comprises depletion HEMT transistors configured to drive the gates of the N depletion HEMT transistors of the power circuit, and in that the power circuit is power supplied with N non-zero and positive power supply voltages, namely, a low power supply voltage, a high power supply voltage and (N−2) intermediary power supply voltage(s), the high power supply voltage being greater than the low power supply voltage, each intermediary power supply voltage being different from the low and high power supply voltages and the (N−2) intermediary power supply voltages being different from each other and comprised between the low and high power supply voltages.

The expression "high power" means powers greater than 1 W.

The expression "high frequencies" means switching frequencies greater than 10 MHz.

The multi-power supply voltage dc/dc converter block is thus particularly suitable for the envelope tracking technique, the (so-called normally closed) depletion HEMT microwave transistors being particularly suitable for high-power applications with high switching frequencies.

Different technologies of semi-conductors can be used for making depletion HEMT transistors, these materials mainly being gallium nitride (GaN) and gallium arsenide (GaAs), but also any other semi-conductor material comprising group III-V materials such as AlGaN, AlN, InAlN, InAlGaN, etc.

The use of depletion HEMT RF and microwave transistors provides a great potential in terms of operation frequency thanks to their very low parasitic capacitances, this type of transistors conventionally allowing to provide power amplification functions up to several tens of gigahertz, this type of transistor further providing the advantages of being available according to different gate developments and of being easily integrated in MMIC (monolithic microwave integrated circuits) monolithic circuits.

In addition, the very low parasitic capacitances of these depletion HEMT transistors associated with high breakdown voltages make this type of components particularly suited to the high-power (>1 W) fast-switching applications.

The depletion HEMT transistors further have the advantage of being usable in forward and reverse conduction. They do not necessarily require Schottky diodes arranged in parallel for handling reverse currents, thereby allowing to minimize the parasitic capacitances and therefore to provide higher switching frequencies.

The gate driving circuit is integrated to the dc/dc converter block in the same technology, that is, comprising depletion HEMT transistors, thereby allowing to provide a low-consumption and ultra-fast gate driving circuit.

The multi-power supply voltage dc/dc converter block further allows, via the driving circuit driven by digital signals, to select a single power supply voltage from the N power supply voltages.

The intermediary power voltages may be evenly distributed or not between the high and low voltages.

According to a particular feature of the invention, the power circuit comprises a depletion HEMT lower power transistor and (N−1) depletion HEMT upper power transistors, the conduction output terminal of the lower power transistor being connected to the low power supply voltage, the conduction input terminal of one of the upper power transistors being connected to the high power supply voltage, the conduction input terminals of the (N−2) other upper power transistors being respectively connected to the (N−2) intermediary power supply voltages, the output of the power circuit being connected to the conduction input terminal of the lower power transistor and to the conduction output terminals of the (N−1) upper power transistors, and the gates of the lower and upper power transistors being connected to the driving circuit of the dc/dc converter block, such that the output voltage of the power circuit of the dc/dc converter block is bounded by the low and high power supply voltages.

The HEMT power transistors can be operated in forward (quadrant $(V_{ds}, I_{ds}) > 0$) or reverse (quadrant $(V_{ds}, I_{ds}) < 0$) conduction. In forward conduction, the conduction input terminal is the drain and the conduction output terminal is the source. In reverse conduction, the conduction input terminal is the source and the conduction output terminal is the drain.

The HEMT lower power transistor associated with the low power supply voltage is preferably operated in reverse conduction, the source of said lower power transistor being preferably connected to the low power supply voltage. It can be noted that the upper and lower power transistors can be operated in forward conduction or reverse conduction.

The size of the HEMT power transistors can be different for each HEMT power transistor according to the power supply voltages provided thereto.

The multi-power supply voltage dc/dc converter block allows, via the driving circuit, to select, as an output voltage, a power supply voltage from the N power supply voltages, said output voltage being thus bounded by the low and high power supply voltages.

When the driving circuit drives the gate of the lower power transistor to close the latter and the gates of the upper power transistors to open the latter, the output voltage of the power circuit is thus equal to the low power supply voltage, and when the driving circuit drives the gate of the lower power transistor to open the latter and the gates of the upper power transistors to close one of the upper power transistors and open the other upper power transistors, the output voltage of the power circuit is equal to the high or intermediary power supply voltage associated with the upper power transistor in the closed state.

According to a particular feature of the invention, the multi-power supply voltage dc/dc converter block further comprises power supply bypass capacitors respectively arranged in parallel to the N power supply voltages.

Thus, the power supply bypass capacitors allow to ensure the stability of the high-frequency HEMT transistors to and filter parasites present in the power supply voltages.

According to a particular feature of the invention, the driving circuit comprises, for each gate of depletion HEMT transistor of the power circuit to be driven, a first depletion HEMT driving transistor, a second depletion HEMT driving transistor, first, second and third resistors, a Schottky diode and an auxiliary power supply voltage, the source of the first driving transistor being connected to the ground, the drain of the first driving transistor being connected to one of the terminals of the first resistor and to one of the terminals of the second resistor, the gate of the first driving transistor being connected to a corresponding input of the driving circuit, the gate of the second driving transistor being connected to the other of the terminals of the first resistor, the source of the second driving transistor being connected to the other of the terminals of the second resistor, to the cathode of the Schottky diode and to one of the terminals of the third resistor, the anode of the Schottky diode being connected to the auxiliary power supply voltage, the other of the terminals of the third resistor being connected to the gate of the corresponding depletion HEMT transistor of the power circuit to be driven, the drain of the second driving transistor being connected to the low power supply voltage if the low power supply voltage is connected to the conduction output terminal of the corresponding depletion HEMT transistor of the power circuit to be driven, or being connected to the corresponding intermediary or high power supply voltage if the corresponding intermediary or high power supply voltage is connected to the conduction input terminal of the corresponding depletion HEMT transistor of the power circuit to be driven, the auxiliary power supply voltage being greater than the pinch-off voltage of the second driving transistor, and the low power supply voltage being greater than the auxiliary power supply voltage plus the pinch-off voltage of the corresponding depletion HEMT transistor of the power circuit to be driven.

Each Schottky diode of the driving circuit can be in Si, SiC, GaAs or GaN technology, but can also be based on semi-conductor materials constituted by III-V group materials such as AlGaN, AlN, InAlN, InAlGaN, etc.

The architecture of the driving circuit of the gates of the power transistors makes the multi-power supply voltage dc/dc converter block extremely flexible in frequency. Indeed, the driving circuit of the gates of the power transistors being coupled in direct current, there is no limitation in terms of maximum and minimum switching frequencies, the maximum switching frequency being actually limited by the second resistor of the driving circuit, by the gate-source capacitance ($C_{GS}$) of the second driving transistor of the driving circuit, and by the efficiency of the depletion HEMT transistors themselves.

The specific architecture of the gate driving circuit thus allows to reach very high switching speeds.

In addition, for each depletion HEMT transistor of the power circuit to be driven, the part of the driving circuit associated with the corresponding power transistor to be driven has a zero consumption when it closes the corresponding power transistor and consumes very little power when the corresponding power transistor is open, by using an auxiliary supply and the diode arranged at the output of this auxiliary supply.

The auxiliary power supply voltage should be greater than the pinch-off voltage of the second driving transistor such that it can be open, and the low power supply voltage should be greater than the auxiliary power supply voltage plus the pinch-off voltage of the depletion HEMT transistor of the corresponding power circuit to be driven such that the corresponding depletion HEMT transistor of the power circuit can be open.

The first and third resistors are stabilizing resistors allowing to control the risk of oscillation of the depletion HEMT transistors having very high gains.

The second resistor directly influences the switching speed of the gate driving circuit, a lower second-resistor value leading, for a given second-driving-transistor gate development, to a switching speed increased but involving a higher electric consumption when the power transistor to be driven is open, thereby providing a tradeoff between the speed and the consumption of the existing driving circuit for a given second-driving-transistor gate development.

It can be noted that the driving circuit comprises N power transistor gate driving parts respectively driving the gates of the N power transistors.

According to a particular feature of the invention, each input voltage at a corresponding input of the driving circuit is negative and between 0V and $-V_p$, $V_p$ being the pinch-off voltage of the driving transistor whose gate is connected to said corresponding input of the driving circuit, said input voltage being power supplied by an interface circuit connected to a control digital circuit.

The control digital circuit is one among a digital signal processor (DSP), a field programmable gate array (FGPA), an application specific integrated circuit (ASIC) or any other digital circuit allowing to drive the dc/dc converter block.

The interface circuit allows to provide each input voltage to the driving circuit from the digital control provided by the control digital circuit.

According to a particular feature of the invention, only one input voltage at a time, from the input voltages of the driving circuit, is in an activated state.

At each moment, a single HEMT power transistor is therefore controlled in the closed state in order to apply its power supply voltage as an output voltage of the power circuit, the other HEMT power transistors being controlled in the open state.

It can be noted that the control digital circuit can also be configured to compensate for the differences in rise and fall times among the power transistors to be driven.

According to a particular feature of the invention, the sizes of gate of the depletion HEMT transistors of the driving circuit are lower than those of the depletion HEMT transistors of the power circuit.

This has the advantage of making the parasitic capacitance ($C_{GS}$) of the second driving transistor significantly minimum and thus of allowing to use second-resistor values high enough to ensure that the driving circuit consumes little power.

According to a first alternate embodiment of the invention, all components of the multi-power supply voltage dc/dc converter block are discrete components mounted on a printed circuit board or connected thereto by connecting wires.

The multi-power supply voltage dc/dc converter block can therefore be made from discrete components such as transistors, diodes, resistors and capacitors into a packaging. It can also be made from components into a chip in a hybrid circuit.

According to a second alternate embodiment of the invention, all components of the multi-power supply voltage dc/dc converter block are monolithically integrated in an integrated circuit.

This allows to integrate the multi-power supply voltage dc/dc converter block and a RF power amplifier power supplied by the multi-power supply voltage dc/dc converter block in the same technology and thus on a same chip, this integration could be directly monolithically made in a MMIC circuit in order to increase the integration of the multi-power supply voltage dc/dc converter block.

The electronic circuit can also comprise, if needed, a linear amplifier which will then be associated with the multi-power supply voltage dc/dc converter block.

In the case of a MMIC implementation, the linear amplifier can be integrated on the MMIC.

According to a particular feature of the invention, the HEMT transistors of the power circuit and the HEMT transistors of the driving circuit are made from one among gallium nitride (GaN), gallium arsenide (GaAs) or any other semi-conductor material constituted by III-V type materials.

According to a particular feature of the invention, the diodes are Schottky diodes and made of Si, SiC, GaAs, GaN technology or any other semi-conductor material constituted by III-V type materials.

In addition, in the case of a monolithic integration of the RF power amplifier and of the multi-power supply voltage dc/dc converter block, the technology of the transistors being identical, the voltage withstand constraints are directly compatible.

The present invention also relates to a high-frequency and high-power multi-power supply voltage dc/dc converter for the envelope tracking technique, characterized in that it comprises a multi-power supply voltage dc/dc converter block as defined above and an output filter connected to the output of the power circuit of the multi-power supply voltage dc/dc converter block, the filter being preferably constituted by capacitors and inductors, the output of the output filter constituting the output of the high-frequency and high-power multi-power supply voltage dc/dc converter.

Thus, in the case of a direct-control envelope tracking application in which the multi-power supply voltage dc/dc converter is used in buck mode, the output filter, constituted for example by capacitors and inductors, allows to rebuild the bias signal to be applied on the power supply voltage input of a RF power amplifier from a sigma-delta or PWM (pulse wave modulation) digital control signal. In this case, the architecture of the dc/dc converter block with a buck-type power circuit is particularly optimized for the envelope tracking technique by using the N power supply voltages among which the high and low power supply voltages bound the voltage generated by the dc/dc converter block, thereby allowing to significantly minimize the losses during the switching phases of the dc/dc converter block, with the high and intermediary power supply voltages greater than the low power supply voltage in order to ensure the good operation of the dc/dc converter block.

In addition, the use of a buck-type power circuit has also the advantage of providing a driving simplicity in the case of the direct-control envelope tracking technique. Indeed, the buck-type power circuit is easier to control than a boost-type power circuit because it is easy to use without any negative feedback loop, even in the case where it is exposed to changes in load impedance or, worse, to the lack of any load.

In the case of a discrete-control envelope tracking application in which the multi-power supply voltage dc/dc converter is used as a voltage selector, the output filter, constituted for example by capacitors and inductors, is a low-pass filter whose function simply consists in controlling the switching times between each voltage level to be applied to the RF amplifier.

The present invention also relates to a high-frequency and high-power multi-power supply voltage dc/dc converter for the envelope tracking technique, characterized in that it comprises a multi-power supply voltage dc/dc converter block as defined above, the output of the power circuit of the multi-power supply voltage dc/dc converter block constituting the output of the high-frequency and high-power multi-power supply voltage dc/dc converter.

In the case of a discrete-control envelope tracking application in which the multi-power supply voltage dc/dc converter is used as a voltage selector, the output of the power circuit of the multi-power supply voltage dc/dc converter block is therefore directly applied to the RF amplifier, the voltage applied to the RF amplifier being one among the N power supply voltages.

The present invention also relates to a system for the envelope tracking technique comprising a multi-power supply voltage dc/dc converter for the envelope tracking technique as defined above, a radiofrequency (RF) power amplifier and an envelope tracking processing digital circuit, the envelope tracking processing digital circuit controlling the multi-power supply voltage dc/dc converter and the RF power amplifier, and the output of the multi-power supply voltage dc/dc converter being connected to the power supply voltage input of the RF power amplifier.

The high power supply voltage of the multi-power supply voltage dc/dc converter corresponds to the maximum power supply voltage of the RF power amplifier when the latter provides a maximum output power, and the low power supply voltage of the multi-power supply voltage dc/dc converter corresponds to the minimum power supply voltage of the RF power amplifier when the output power thereof is low. Both high and low power supply voltages are thus selected according to the microwave electric characteristics of the RF power amplifier to be controlled according to the envelope tracking technique, the intermediary power supply voltages being selected according to the statistics of the signals to be emitted, these statistics depending themselves on the modulation format and on the microwave electric characteristics of the RF power amplifier to be power supplied.

For a better understanding of the subject-matter of the present invention, a preferred embodiment will be described below, for illustrative and non-limiting purposes, in reference to the appended drawing.

In the drawing:

FIG. 1 is a schematic diagram of a multi-power supply voltage dc/dc converter block according to the present invention.

If referring to FIG. 1, a multi-power supply voltage dc/dc converter block according to the present invention is shown.

The multi-power supply voltage dc/dc converter block comprises a power circuit power supplied with N non-zero and positive power supply voltages, that is, a low power supply voltage VDD_1, a high power supply voltage VDD_N and (N−2) intermediary power supply voltages VDD_2-VDD_N−1, N being a positive integer greater than or equal to 3, the high power supply voltage VDD_N being greater than the low power supply voltage VDD_1, the (N−2) intermediary power supply voltages VDD_2-VDD_N−1 being distributed, uniformly or non-uniformly, between the low VDD_1 and high VDD_N power supply voltages.

It can be noted that only the components associated with the power supply voltages VDD_1, VDD_2 and VDD_N have been shown in FIG. 1 in order to facilitate the understanding of the reader.

The multi-power supply voltage dc/dc converter block further comprises a driving circuit of the power circuit.

The low VDD_1 and high VDD_N power supply voltages are selected according to the microwave electric characteristics of a RF power amplifier power supplied by a dc/dc converter comprising the multi-power supply voltage dc/dc converter block, and can have, for example, values of 20V et 50V, respectively.

The power circuit comprises a depletion HEMT lower power transistor T3_1 and (N−1) depletion HEMT upper power transistors T3_2-T3_N, the source of the lower power transistor T3_1 being connected to the low power supply voltage VDD_1, the drain of one T3_N of the upper power transistors T3_2-T3_N being connected to the high power supply voltage VDD_N, the drains of the (N−2) other upper power transistors T3_2-T3_N−1 being respectively connected to the (N−2) intermediary power supply voltages VDD_2-VDD_N−1, the output $V_{OUT}$ of the power circuit being connected to the drain of the lower power transistor T3_1 and to the sources of the (N−1) upper power transistors T3_2-T3_N, and the gates of the lower T3_1 and upper T3_2-T3_N power transistors being connected to the driving circuit of the multi-power supply voltage dc/dc converter block, such that the output voltage $V_{OUT}$ of the power circuit of the multi-power supply voltage dc/dc converter block is bounded by the low VDD_1 and high VDD_N power supply voltages.

The multi-power supply voltage dc/dc converter block further comprises power supply bypass capacitors C1_1-C1_N respectively arranged in parallel to the N power supply voltages VDD_1-VDD_N.

The capacitors C1_1-C1_N have, for example, values between 10 pF and 1 nF, the one skilled in the art knowing how to adjust the values according to the other components and to the required characteristics.

It can be noted that the multi-power supply voltage dc/dc converter block may not have power supply bypass capacitors, without departing from the scope of the present invention.

The driving circuit is configured to drive the gates of the power transistors T3_1-T3_N, and comprises, for each gate of depletion HEMT transistor T3_1-T3_N of the power circuit to be driven, a first depletion HEMT driving transistor T1_1-T1_N, a second depletion HEMT driving transistor T2_1-T2_N, first, second and third resistors R1_1-R1_N, R2_1-R2_N and R3_1-R3_N, a Schottky diode D1_1-D1_N, and an auxiliary power supply voltage $V_{AUX}$, the source of the first driving transistor T1_1-T1_N being connected to the ground, the drain of the first driving transistor T1_1-T1_N being connected to one of the terminals of the first resistor R1_1-R1_N and to one of the terminals of the second resistor R2_1-R2_N, the gate of the first driving transistor T1_1-T1_N being connected to a corresponding input $V_{IN\_1}$-$V_{IN\_N}$ of the driving circuit, the gate of the second driving transistor T2_1-T2_N being connected to the other of the terminals of the first resistor R1_1-R1_N, the source of the second driving transistor T2_1-T2_N being connected to the other of the terminals of the second resistor R2_1-R2_N, to the cathode of the Schottky diode D1_1-D1_N and to one of the terminals of the third resistor R3_1-R3_N, the anode of the Schottky diode D1_1-D1_N being connected to the auxiliary power supply voltage $V_{AUX}$, the other of the terminals of the third resistor R3_1-R3_N being connected to the gate of the corresponding depletion HEMT transistor T3_1-T3_N of the power circuit to be driven.

The drain of the second driving transistor T2_1 associated with the lower power transistor T3_1 is connected to the low power supply voltage VDD_1.

The drain of the second driving transistor T2_N associated with the upper power transistor T3_N is connected to the high power supply voltage VDD_N.

Each drain of the second driving transistors T2_2-T2_N−1 associated with the upper power transistors T3_2-T3_N−1 is connected to the corresponding intermediary power supply voltage VDD_2-VDD_N−1.

The auxiliary power supply voltage $V_{AUX}$ is greater than the pinch-off voltage of the second driving transistor T2_1-T2_N in order to open the latter, and the low power supply voltage VDD_1 is greater than the auxiliary power supply voltage $V_{AUX}$ plus the pinch-off voltage of the corresponding depletion HEMT power transistor T3_1-T3_N in order to open the latter.

The auxiliary voltage $V_{AUX}$ is, for example, equal to 3V.

It can be noted that the auxiliary voltage $V_{AUX}$ could also be different for each driving circuit part associated with a power transistor T3_1-T3_N, without departing from the scope of the present invention.

The gate developments of the depletion HEMT driving transistors T1_1-T1_N and T2_1-T2_N of the driving circuit are much lower than those of the depletion HEMT power transistors T3_1-T3_N of the power circuit. The driving transistors T1_1-T1_N and T2_1-T2_N have, for example, gate developments 10 to 30 times lower than those of the power transistors T3_1-T3_N.

It can be noted that the size of the HEMT power transistors T3_1-T3_N can be different for each HEMT power transistor T3_1-T3_N according to the power supply voltages VDD_1-VDD_N presented thereto.

The first, second and third resistors R1_1-R1_N, R2_1-R2_N and R3_1-R3_N have, for example, values of 10 Ohms, 50 ohms and 10 Ohms, respectively.

Obviously, these values depend on many factors, such as the transistors or the technology used. They are thus indicated here for illustrative and non-limiting purposes, and the one skilled in the art will know how to adapt them according to the characteristics of the converter.

It can be noted that the depletion HEMT transistors T1_1-T1_N, T2_1-T2_N and T3_1-T3_N have the advantage of being able to be used in forward and reverse conduction modes, and thus they do not necessarily require the use of antiparallel Schottky diodes for managing reverse currents, thereby allowing to minimize the parasitic capacitances in the circuit.

Different technologies of semi-conductors can be used for making depletion HEMT transistors T1_1-T1_N, T2_1-T2_N and T3_1-T3_N, these materials mainly being gallium nitride (GaN) and gallium arsenide (GaAs), but also any other semi-conductor material constituted by III-V group materials such as AlGaN, AlN, InAlN, InAlGaN, etc.

The Schottky diodes D1_1-D1_N can be in Si, SiC, GaAs or GaN technology, but can also be based on semi-conductor materials constituted by III-V group materials such as AlGaN, AlN, InAlN, InAlGaN, etc.

Each input voltage $V_{IN\_1}$-$V_{IN\_N}$ at a corresponding input of the driving circuit is negative and between 0V and –Vp, Vp being the pinch-off voltage of the driving transistor T1_1-T1_N whose gate is connected to said corresponding input of the driving circuit, said input voltages $V_{IN\_1}$-$V_{IN\_N}$ being supplied in power by an interface circuit (not shown in FIG. 1) connected to a control digital circuit.

The control digital circuit is one among a digital signal processor (DSP), a field programmable gate array (FGPA), an application specific integrated circuit (ASIC) or any other digital circuit allowing to drive the multi-power supply voltage dc/dc converter block.

The interface circuit allows to provide each input voltage to the driving circuit from the digital controls provided by the control digital circuit.

Each driving circuit part is associated with a power transistor T3_1-T3_N such that only one power transistor T3_1-T3_N at a time is in a closed state. Two states are thus possible for characterizing a driving circuit part associated with a power transistor T3_1-T3_N.

As an example, in the case of the power transistor T3_1, in a first state called "extinction state" in which the control digital signal applies an input voltage $V_{IN1\_1}$=0V, the first driving transistor T1_1 is closed, the gate of the second driving transistor T2_1 is grounded as well as the terminal of the second resistor R2_1 connected to the drain of the first driving transistor T1_1, thereby applying a current in the second resistor R2_1 from the auxiliary supply $V_{AUX}$ through the diode D1_1. The resulting voltage across the second resistor R2_1 opens the second driving transistor T2_1 and the auxiliary voltage $V_{AUX}$ is applied to the gate of the power transistor T3_1 to be driven, thereby blocking the latter regardless of the other power transistors T3_2-T3_N being in the closed state. Thus, in this state, the consumption of the driving circuit is limited to the current passing through the second resistor R2_1 and the diode D1_2 from the auxiliary voltage $V_{AUX}$.

Due to the fact that the transistors used are microwave HEMT transistors having very high gains, there is a risk of oscillation (instability) of said transistors. In order to control this risk, the first and third resistors R1_1-R1_N and R3_1-R3_N which are stabilizing resistors have been positioned on the gates of the first driving transistor T1_1-T1_N and of the power transistor T3_1-T3_N to be driven.

It can be noted that the multi-power supply voltage dc/dc converter block may not comprise stabilizing resistors R1_1-R1_N and R3_1-R3_N, without departing from the scope of the present invention.

As an example, in the case of the power transistor T3_1, in a second state called "activation state" in which the control digital signal applies an input voltage $V_{IN1}$=–Vp, the first driving transistor T1_1 is open. The current in the second resistor R2_1 being zero, the gate-source voltage of the second driving transistor T2_1 is equal to 0V and the second driving transistor T2_1 is thus closed, thereby applying the low power supply voltage VDD_1 on the gate of the power transistor T3_1 and blocking the diode D1_1. The power transistor T3_1 is thus closed, applying the low power supply voltage VDD_1 on the output voltage $V_{OUT}$ of the power circuit, the other power transistors T3_2-T3_N being in the blocked state. In this state, the diode D1_1 and the first driving transistor T1_1 being blocked, the consumption of the gate driving circuit is zero.

The multi-power supply voltage dc/dc converter block thus allows, via the driving circuit driven by digital signals, to select, as an output voltage $V_{OUT}$, a single power supply voltage from the N power supply voltages VDD_1-VDD_N.

It can be noted that the control digital circuit can be configured to compensate for the differences in rise and fall times between the power transistors T3_1-T3_N.

The second resistor R2_1-R2_N directly influences the switching speed of the gate driving circuit. For a given second-driving-transistor gate development T2_1-T2_N, a lower value of the second resistor R2_1-R2_N will lead to an increased switching speed, but will involve a higher consumption when the power transistor T3_1-T3_N to be driven is open. Thus, there is, for a given second-driving-transistor gate development T2_1-T2_N, a tradeoff between the speed and the consumption of the driving circuit.

However, the architecture of the multi-power supply voltage dc/dc converter block has the advantage that the first and second driving transistors T1_1-T1_N and T2_1-T2_N with gate developments which are very low in relation to the gate development of the power transistor T3_1-T3_N are enough to drive the power transistor T3_1-T3_N because it is not necessary to provide a high current to drive the gate of the power transistor T3_1-T3_N. It has the advantage of significantly minimizing the gate-source parasitic capacitance of the second driving transistor T2_1-T2_N which will thus be very low and allow to use values of the second resistor R2_1-R2_N high enough to ensure a low consumption of the driving circuit.

All components of the multi-power supply voltage dc/dc converter block are either discrete components mounted on a printed circuit board, or monolithically integrated in an integrated circuit.

In the case of a monolithic integration, this can allow to integrate a dc/dc converter comprising the multi-power supply voltage dc/dc converter block and a RF power amplifier power supplied by the dc/dc converter in the same technology and thus on a same chip, this integration could be directly performed monolithically in a MMIC circuit in order to increase the integration of the dc/dc converter.

The HEMT power transistors T3_1-T3_N can be operated in forward or reverse conduction mode, that is, according to two quadrants $(V_{DS}, I_{DS})>0$ or $(V_{DS}, I_{DS})<0$. As a result, each power transistor T3_1-T3_N can be mounted by inverting the drain and the source, the wiring of the driving circuit remaining unchanged in these conditions, the power transistors T3_1-T3_N can be inverted independently from each other.

It can be noted that the driving diodes D1_1-D1_N could be replaced with HEMT transistors having the same technology as the other transistors of the circuit, without departing from the scope of the present invention.

The invention also relates to a high-frequency and high-power multi-power supply voltage dc/dc converter for the envelope tracking technique, characterized in that it comprises a multi-power supply voltage dc/dc converter block as defined above and, optionally, an output filter connected to the output of the power circuit of the multi-power supply voltage dc/dc converter block, the filter being preferably constituted by capacitors and inductors, the output of the output filter constituting the output of the high-frequency and high-power multi-power supply voltage dc/dc converter.

In the case of a direct-control envelope tracking application in which the multi-power supply voltage dc/dc converter is used operating in buck configuration, the output filter, constituted for example by capacitors and inductors, allows to rebuild the bias signal to be applied on the power supply voltage input of a RF power amplifier from a sigma-delta or PWM (pulse wave modulation) digital control signal. Thus, the multi-power supply voltage dc/dc converter block associated with the output reconstruction filter has the advantage of reducing the residual ripple at the output with respect to a conventional buck converter, increasing the bandwidth of the converter and also reducing the switching losses.

In the case of a discrete-control envelope tracking application in which the multi-power supply voltage dc/dc converter is used as a voltage selector, the output filter, constituted for example by capacitors and inductors, is a low-pass filter whose function simply consists in controlling the switching times between each voltage level to be applied to the RF amplifier. This dc/dc converter therefore allows to reach high switching frequencies and thus a large bandwidth having together with a good efficiency.

It can be noted that, in the case of a discrete-control envelope tracking application, the output of the power circuit of the multi-power supply voltage dc/dc converter block can also be directly applied to the RF amplifier, the voltage applied to the RF amplifier being one among the N power supply voltages.

The invention also relates to a system for the envelope tracking technique comprising a multi-power supply voltage dc/dc converter for the envelope tracking technique according to the present invention, a RF power amplifier and an envelope tracking processing digital circuit, the envelope tracking processing digital circuit controlling the multi-power supply voltage dc/dc converter and the RF power amplifier, and the output of the multi-power supply voltage dc/dc converter being connected to the power supply voltage input of the RF power amplifier.

Thus, the high power supply voltage VDD_N of the multi-power supply voltage dc/dc converter corresponds to the maximum power supply voltage of the RF power amplifier when the latter provides a maximum output power, and the low power supply voltage VDD_1 of the multi-power supply voltage dc/dc converter corresponds to the minimum power supply voltage of the RF power amplifier when its output power is low.

The invention claimed is:

1. A high-frequency and high-power multi-power supply voltage dc/dc converter block comprising:
a power circuit, the output of the power circuit being the output of the dc/dc converter block, the power circuit comprising N depletion high-electron-mobility (HEMT) transistors, N being a positive integer greater than or equal to 3; and
a driving circuit comprising depletion HEMT transistors configured to drive gates of the N depletion HEMT transistors of the power circuit,
wherein the power circuit is power supplied with N non-zero and positive power supply voltages including a low power supply voltage, a high power supply voltage, and (N−2) intermediary power supply voltages, the high power supply voltage being greater than the low power supply voltage, each intermediary power supply voltage being different from the low and high power supply voltages and the (N−2) intermediary power supply voltages being different from each other and comprised between the low and high power supply voltages, and
the driving circuit comprises, for each gate of the respective depletion HEMT transistor of the power circuit to be driven,
a first depletion HEMT driving transistor of the depletion HEMT transistors of the driving circuit,
a second depletion HEMT driving transistor of the depletion HEMT transistors of the driving circuit,
first, second, and third resistors,
a Schottky diode, and
an auxiliary power supply voltage,
the source of the first depletion HEMT driving transistor being connected to the ground,
the drain of the first depletion HEMT driving transistor being connected to one of the terminals of the first resistor and to one of the terminals of the second resistor,
the gate of the first depletion HEMT driving transistor being connected to a corresponding input of the driving circuit, the gate of the second depletion HEMT driving transistor being connected to the other of the terminals of the first resistor,
the source of the second depletion HEMT driving transistor being connected to the other of the terminals of the second resistor, to the cathode of the Schottky diode and to one of the terminals of the third resistor,
the anode of the Schottky diode being connected to the auxiliary power supply voltage,
the other of the terminals of the third resistor being connected to the gate of the corresponding depletion HEMT transistor of the power circuit to be driven,
the drain of the second depletion HEMT driving transistor being connected to the low power supply voltage when the low power supply voltage is connected to the conduction output terminal of the corresponding depletion HEMT transistor of the power circuit to be driven, or being connected to the corresponding intermediary or high power supply voltage when the intermediary or high power supply voltage is connected to the conduction input terminal of the corresponding depletion HEMT transistor of the power circuit to be driven,
the auxiliary power supply voltage being greater than the pinch-off voltage of the second depletion HEMT driving transistor, and
the low power supply voltage being greater than the auxiliary power supply voltage plus the pinch-off voltage of the corresponding depletion HEMT transistor of the power circuit to be driven.

2. The high-power multi-power supply voltage dc/dc converter block according to claim 1, wherein the N depletion HEMT transistors of the power circuit comprise a depletion HEMT lower power transistor and (N−1) depletion HEMT upper power transistors, the conduction output terminal of the depletion HEMT lower power transistor being connected to the low power supply voltage, the conduction input terminal of one of the depletion HEMT upper power transistors being connected to the high power supply voltage, the conduction input terminals of the (N−2) other depletion HEMT upper power transistors being respectively connected to the (N−2) intermediary power supply voltages, the output of the power circuit being connected to the conduction input terminal of the depletion HEMT lower power transistor and to the conduction output terminals of the (N−1) depletion HEMT upper power transistors, and the gates of the depletion HEMT lower and upper power transistors being connected to the driving circuit of the high-power multi-power supply voltage dc/dc converter block, such that the output voltage of the power circuit of the high-power multi-power supply voltage dc/dc converter block is bounded by the low and high power supply voltages.

3. The high-power multi-power supply voltage dc/dc converter block according to claim 1, further comprising power supply bypass capacitors respectively arranged in parallel to the N power supply voltages.

4. The high-power multi-power supply voltage dc/dc converter block according to claim 1, wherein each input voltage at a corresponding input of the driving circuit is negative and between 0V and −Vp, Vp being the pinch-off voltage of the first depletion HEMT driving transistor whose gate is connected to the corresponding input of the driving circuit, the input voltage being provided by an interface circuit connected to a control digital circuit.

5. The high-power multi-power supply voltage dc/dc converter block according to claim 1, wherein only one input voltage at a time, among the input voltages of the driving circuit, is in an activated state.

6. The high-power multi-power supply voltage dc/dc converter block according to claim 1, wherein the sizes of gates of the depletion HEMT transistors of the driving circuit are lower than gates of the depletion HEMT transistors of the power circuit.

7. The high-power multi-power supply voltage dc/dc converter block according to claim 1, wherein all components of the high-power multi-power supply voltage dc/dc converter block are discrete components mounted on a printed circuit board.

8. The high-power multi-power supply voltage dc/dc converter block according to claim 1, wherein all components of the high-power multi-power supply voltage dc/dc converter block are monolithically integrated in an integrated circuit.

9. The high-power multi-power supply voltage dc/dc converter block according to claim 1, wherein the depletion HEMT transistors of the power circuit and the depletion HEMT transistors of the driving circuit are made of one of gallium nitride (GaN), gallium arsenide (GaAs) and any other semi-conductor material constituted by III—V type materials.

10. The high-power multi-power supply voltage dc/dc converter block according to claim 1, wherein the Schottky diodes are made of one of Si, SiC, GaAs, GaN technology and any other semi-conductor material constituted by III-V type materials.

11. A system for an envelope tracking technique comprising:
the high-power multi-power supply voltage dc/dc converter block according to claim 1;
a RF power amplifier; and
an envelope tracking processing digital circuit controlling the high-power multi-power supply voltage dc/dc converter block and the RF power amplifier, and the output of the high-power multi-power supply voltage dc/dc converter block being connected to a power supply voltage input of the RF power amplifier.

* * * * *